United States Patent

[11] 3,581,113

[72] Inventor Wilhelm Kafka
Tennenlohe, Germany
[21] Appl. No. 747,684
[22] Filed July 25, 1968
[45] Patented May 25, 1971
[73] Assignee Siemens Aktiengesellschaft
Berlin, Germany
[32] Priority Aug. 4, 1967
[33] Germany
[31] S111185 VIIId/21c

[54] SWITCHING DEVICE FOR DISCONNECTING CABLES

14 Claims, 4 Drawing Figs.

[52] U.S. Cl. .......... 307/245, 307/306, 317/13
[51] Int. Cl. .......... H01v 11/10, H01v 11/16
[50] Field of Search .......... 174/15; 307/245, 306; 317/11, 13 (D)

[56] References Cited

UNITED STATES PATENTS

| | | | |
|---|---|---|---|
| 3,114,845 | 12/1963 | Meyers | 307/245 |
| 3,384,762 | 5/1968 | Mawardi | 307/245 |
| 3,453,449 | 7/1969 | Kafka | 307/245 |

*Primary Examiner*—John Kominski
*Assistant Examiner*—Darwin R. Hostetter
*Attorneys*—Curt M. Avery, Arthur E. Wilfond, Herbert L. Lerner and Daniel J. Tick

ABSTRACT: A switching device for disconnecting superconductive current-carrying cables has a superconductive circuit which provides a high resistance in the normal conducting state. A control mechanism is provided for transferring the superconductive circuit from the superconducting state to the normal conducting state.

SWITCHING DEVICE FOR DISCONNECTING CABLES

My invention relates to switching devices for disconnecting current-carrying cables and in one of its preferred aspects to a switching device for disconnecting high current superconducting cables.

A switching device for superconducting high current cables is known, for example, from German Pat. No. 1,250,526. This device comprises a superconductive section which exhibits a high resistance during the normal conducting state. The superconductive section can be transferred from a superconducting state into a normal conducting state. The switching device further comprises a superconductive disconnect switch connected in series with the superconductive section and a power switch standing at room temperature which is connected in parallel with at least the superconductive section.

Such a switching device makes it possible to commutate the current to be interrupted into a circuit maintained at room temperature and then to disconnect this circuit. In this way, the switching energy is discharged at the room temperature level and may be withdrawn here without difficulty.

It is an object of my invention to improve this type of switching device by providing means for controlling the superconductive section which can cause the critical current density in this section to be exceeded at an arbitrarily selected point in time.

In the known switching device, the control of the superconductive section is effected by an outside magnetic field or by the application of heat. Whereas, in the present invention, the control is produced by exceeding of the critical current density of the superconductive section. This type of control increases the operational safety of the switching device and makes it possible to use the so-called hard superconductors with high critical magnetic fields for the controllable superconductive section without having to supply the latter with heat for control purposes by means of a heating device.

To exceed the critical current density in the controllable superconductive section at an arbitrarily selected point in time, there are two possibilities which are realized in two different embodiments of the switching device of the present invention. In one embodiment, the cross section of the controllable superconductive section is designed to be reduced. Consequently, the current flowing in the controlled superconductive section is crowded into a smaller superconductive cross section causing the critical density to be exceeded. The second embodiment provides means to increase the magnitude of the current above the critical current in the controlled superconductive section. Therefore, in this second embodiment, the current flowing through a controllable superconductive section of constant cross section is increased thereby causing the critical current density to be exceeded.

Even in a switching device, in which the cross section of the controllable superconductive section can be reduced, it is possible to provide additional means for increasing the current magnitude above the critical current. This makes it possible to transfer the superconductive section into the electrically normal conducting state even when the superconductive cable carries no current or only very low current and when the reduction in the cross section of the controllable superconductive section is alone not sufficient for transferring this section into the electrically normal conducting state.

A switching device of the present invention wherein the cross section of the controllable superconductive section can be reduced is preferably constructed so that this section is subdivided into several mutually insulated individual conductors. By means of a parallel connection, the smaller part of these individual conductors forms a first conductor group and the large part forms a second conductor group. An additional superconductive switch is provided which opens the connection between the second conductor group and the superconductive disconnect switch.

In this embodiment of the switching device, the second conductor group is first disconnected from the superconductive disconnect switch during the switching process by opening the additional switch. This commutates the current to the conductors of the first group. These conductors now pass into an electrically normal conducting state because the critical current density is exceeded. During the transfer of these conductors into the electrically normal conducting state, the current is next commutated to the power switch which stands at room temperature. Following this commutation, the superconductive disconnect switch is opened. The charge on the superconductive switch is very low in this embodiment since practically the entire switching energy is released when the power switch is opened. There, the switching energy can be drawn off without difficulty.

The smallest possible mutual inductance between the individual conductors of the first group and the individual conductors of the second group is achieved by spatially intermixing the conductors of both groups. Because no significant magnetic field developes between the two groups with the conductors of both groups intermixed, the current can be commutated with very low commutating voltage from the combined conductor configuration to the first conductor group.

A further reduction of the charge on the superconductive switch can be obtained by providing the switch with a separate switch contact for each single conductor of the second conductor group. These contacts are used to interrupt the connection between the second conductor group and the superconductive disconnect switch.

In a cable comprised of several superconductive conductors which are insulated from each other and which are coated with electrically normal conducting metal for electrical stabilization, it is often desirable during normal operation to provide this electrical stabilization to a substantial degree also within the controllable superconductive section of the switching device. In the switching device of the present invention, this can be achieved by a controllable superconductive section consisting of individual superconductors coated with electrically normal conducting metal. The individual superconductors can be interrupted by a superconductive switch having respective switching contacts for each of the superconductors. The controlled superconductive section is further comprised of a number of other superconductors which are connected in parallel with at least a part of the individual superconductors and which bridge the switch contacts belonging to this portion of superconductors. The other superconductors have a lower critical current and no stabilizing metal coating. The superconductive disconnect switch in serial connection with the controllable superconductive section has a separate switch contact for each cable wire.

The connection leads between the superconductors and the power switch standing at room temperature may be separately directed from the connecting points with the superconductors to a point maintained at higher temperature. This higher temperature can be at room temperature or at a temperature intermediate room temperature and the operational temperature of the superconducting cable of approximately 4.2° K. The intermediate temperature may be maintained by cooling means, for example, with gaseous helium or liquid nitrogen. Since a relatively high electrical resistance is present between the individual superconducting wires in this special arrangement of the connection leads, the current flows through the switching device while the cable is in operation without a significant transfer of current from one superconducting wire to the other. During the switching process, the superconductive switch which disconnects the individual superconductors is opened first. The current is thereby commutated to the parallel connected superconductors which bridge the switch contacts of the superconductive switch. Because the critical current density is exceeded, these superconductors transfer into the electrically normal conducting state which results in a commutation of the current to the power switch standing at room temperature. Following this, the superconductive disconnect switch is opened and then the power switch standing at room temperature is also opened. This embodiment of the present invention is particularly advantageous when the individual cable wires are terminated at the cable end by mutually equal resistors. These resistors prevent an uneven current distribution from occurring on the cable wires. An impairment of the functioning of the terminating resistors by the switching device can be avoided in this embodiment.

It is advantageous to provide a capacitor at room temperature which can be discharged through the controllable superconductive section as a means for exceeding the critical current magnitude of the superconductive section of the switching device. Accordingly, the discharge current flows in the same direction as the cable current. Ignitable spark gaps can be provided to connect the capacitor to the controllable superconductive section. It is also advantageous in this embodiment to design the switching device so that the inductivity of the controllable superconductive section will be small relative to the inductivity of the conductor branch comprised of the power switch standing at room temperature and its leads and, also, small with respect to the inductivity of the cable to be connected. This proportioning of the inductivity of the controllable superconductive section causes the discharge current of the capacitor to flow almost exclusively through this section.

Since the switches used in the switching device must, when necessary, block very high voltages, it is desirable, for the purpose of discharging the switch, to subdivide the power switch standing at room temperature and/or the superconductive switches into several switching paths which are in electrical serial connection.

The invention will be further elucidated with reference to the embodiments illustrated by way of example in the accompanying drawings in which.

Figure 1:
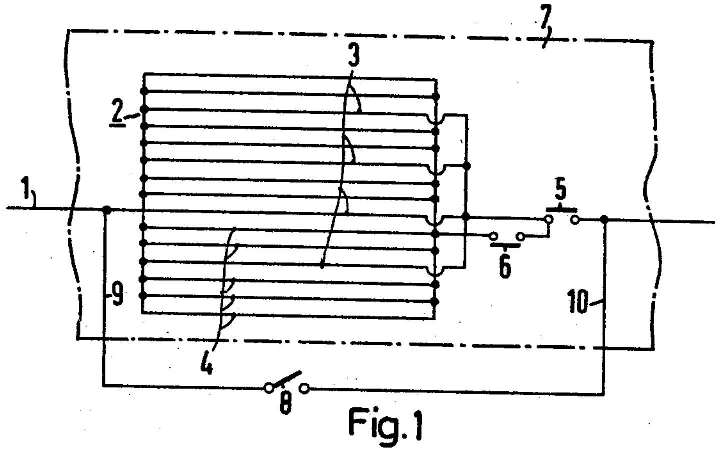
FIG. 1 is a schematic diagram illustrating one embodiment of a switching device of the present invention wherein the controllable superconductive section is subdivided into several individual conductors.

FIG. 1 shows a switching device which is to be connected with a superconducting DC cable 1. The controllable superconductive section 2 is subdivided into several mutually insulated individual conductors of which the smaller portion is parallel connected to form a first conductor group 3 and the larger portion is parallel connected to form a second conductor group 4. The superconductive disconnect switch 5 is connected in series with the two conductor groups. Also, an additional superconductive switch 6 is provided to disconnect the second conductor group 4 from the superconductive disconnect switch 5. The controllable superconductive section 2, as well as the superconductive switches 5 and 6 are located beneath a heat insulator 7, such as a suitable cryostat where they are maintained at superconductance temperatures, for example, at the temperature of liquid helium which is 4.2° K. A power switch 8 standing at room temperature is arranged outside the heat insulator 7 and is connected in parallel with the controllable superconductive section 2 and the superconductive disconnect switch 5 by means of the electrically normal conducting leads 9 and 10 which pass through the heat insulator. The ducts of the leads 9 and 10 through the heat insulator are preferably cooled by helium gas and/or liquid nitrogen in order to keep the penetration of heat into the space within the heat insulator 7 at a minimum.

Power switch 8 can be a quick break switch with the arch occuring in air or sulfur-hexafluoride. The leads 9 and 10 can consist of, for example, copper. In the superconductive switches 5 and 6 the use of hard superconductor material such as the superconducting alloy niobium-65 atom percent titanium or noibium-25 atom percent zirconium is preferred for switching contacts and switching bridges. The individual conductors of the controllable superconductive section 2 can consist of the same hard superconducting material. During the switching process, the superconductive switch 6 is first opened. This commutates the current flowing through the second conductor group 4 to the superconductors of the first conductor group 3. Consequently, the critical current density is exceeded in the first conductor group 3 causing this group to transfer into the electrically normal conducting state. This results in the occurrence of a resistance across the controllable superconductive section 2 and a concomitant voltage drop which causes the current to be commutated to the circuit containing the power switch 8. Following commutation, the superconductive disconnect switch 5 is opened and then the power switch 8 is also opened disconnecting the line 1.

The actuation of switches 5 and 6 should be very quick. This can be achieved with a spring force drive having a magnetic release which can be positioned within the heat insulator 7 or without at room temperature. In case the switch-actuating mechanism is mounted external to the heat insulator 7, the switching movement can be transmitted by levers and spring bellows to the interior of the heat insulator 7.

The total cross section of all the superconducting individual conductors which form the controllable superconductive section 2 is dimensioned so that the highest allowable current which the superconducting cable may carry will flow through the controllable superconductive section without causing the latter to transfer into a state of normal conductance. Assuming that the switch which will carry no more than a current of 30 kiloamperes while in the superconductive state, the required total superconducting cross section is about $6 \times 10^{12}$ cm.$^2$ divided into many thin wires when using superconducting individual conductors of niobium-65 atom percent titanium having a critical current density of about $5 \times 10^{15}$ ampere/cm$^2$.

In the first conductor group 3, so many wires are combined that their resistance in a normal conducting state is high enough to obtain a quick commutation of the current to switch 8. Assuming that the resistance of the conductor circuit which contains switch 8 is about $10^{12}$ ohm, and that prior to its opening a maximum residual current of 3 amperes is to flow through switch 5, then, in order to permit switching at full cable load of 30 kiloamperes, the resistance of the first conductor group 3 in a normal conducting state must be about 10,000 times greater than the resistance of the circuit which contains the switch 8, approximately 100 ohms. Such a resistance can be easily obtained with wires made of the aforementioned superconducting material. These wires have a resistivity in the normal conducting state of approximately $10^{14}$ ohm-cm. at a temperature set by the passage of current. If about one-tenth of the individual conductors of the controllable superconductive section are combined into the first conductor group 3 and nine-tenths of the individual conductors are combined into the second conductor group 4, and in addition, if the individual conductors are intermixed by being placed next to each other in the form of a tape so that nine conductors of the second conductor group 4 are followed by one conductor of the first conductor group 3 and, if, because of its length, the band is folded many times, then a small inductivity is obtained amounting to less than $10^{14}$ henry. This makes it possible to commutate the current from all of the individual conductors of the controllable superconductive section 2 to the conductors of the first conductor group 3, with only a very small commutating voltage at switch 6. Furthermore, at such low inductivity, the time needed for commutating the entire current to the power switch 8 is relatively small amounting to about $10^{15}$ sec. Since the commutating voltage occurring under these conditions at the superconductive switch 5 amounts to approximately 300 v., the single conductors of the controllable superconductive section 2 should be insulated against one another for voltages of about 1,000 v.

Figure 2:
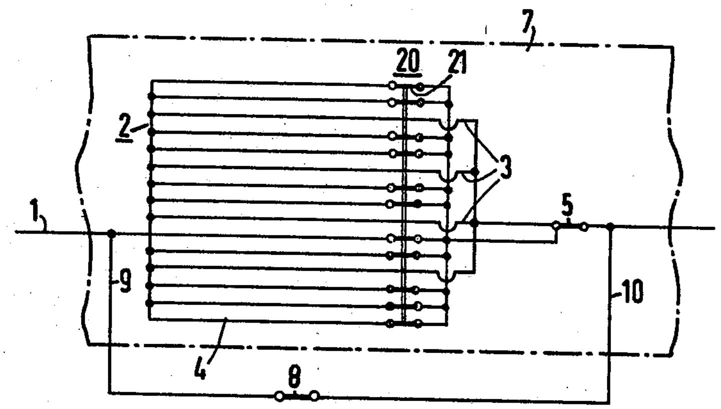
FIG. 2 is a schematic diagram of another embodiment of the switching device wherein the controllable superconductive section is subdivided into several individual conductors.

FIG. 2 shows a switching device for a superconducting high current cable which is similar to the switching device shown in FIG. 1. The corresponding parts therefore have the same reference numerals. The switching device of FIG. 2 differs from the switching device according to FIG. 1 in that superconductive switch 20 is provided in lieu of superconductive switch 6. The latter disconnects the conductors of the second conductor group 4 from the superconductive disconnect switch 5, whereas the superconductive switch 20 has a separate switch contact 21 for each individual conductor of this conductor group. This embodiment effects a still further reduction in the commutating voltages occurring at the switch contacts when the second conductor group is disconnected from the superconductive disconnect switch 5.

Figure 3:
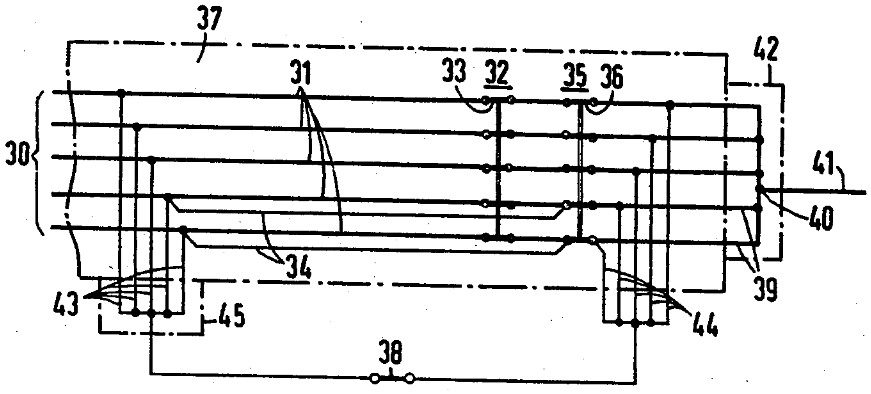
FIG. 3 is a schematic diagram showing a cable of several mutually insulated electrically stabilized superconducting wires equipped with a switching device of the present invention.

FIG. 3 shows an embodiment of the switching device for a DC current cable comprised of many mutually insulated superconducting wires 30 coated with electrically normal metal for electric stabilization. The controllable superconductive section of the switching device has individual superconductors 31 which are also coated with normal conducting metal and are connected with the individual cable wires. The superconductors 31 can be disconnected by a superconductive switch 32 having respective switch contacts for each superconductor. The controllable superconductive section has a number of superconductors 34 which have a lower critical current than the superconductors 31 and have no electrically stabilizing metal coating. The superconductors 34 are connected in parallel with a portion of the superconductors 31 and bridge the switch contacts of the superconductors 31 and bridge the switch contacts of the superconductive switch 32 belonging to this portion of superconductors 31. The superconductive disconnect switch 35 is in serial connection with the superconductors 31 and has respective switch contacts 36 for each cable wire. The superconductive cable, the controllable superconductive section and the superconductive switches are located in a heat insulator 37, such as a cryostat, at a superconductive temperature, particularly, at the temperature of the liquid helium, 4.2° K. A power switch 38 standing at room temperature is connected in parallel with the superconductors 31 and the superconductive disconnect switch 35. The superconductive cable terminates inside the heat insulator 37 where the individual wires or their extensions are connected with resistances 39, the latter being mutually equal and of normal conductivity. Resistances 39 are connected with a normal conductor 41 of larger cross section at a point 40 standing at a higher temperature, for example, at 20° K.

Conductor 41 is directed out from the ancillary heat insulator 42 which maintains higher temperatures up to the level of room temperature. The connecting leads 43 and 44 between the superconductors 31 and the power switch 38 standing at room temperature are directed separately from the connection points with the superconductors to a point which is at higher temperature. The connecting leads 44 which lie closer to the cable end are first connected with each other at a location standing at room temperature, while the connecting leads 43 which are further removed from the cable ends are connected with each other at a location standing at a lower temperature. At the connection point, the connecting leads may be cooled, for example, with gaseous helium to a temperature of about 20° K, or with liquid nitrogen to about 77° K. The connection point is surrounded by a suitable heat insulation 45. The terminal resistances 39 are all of the same value and are large relative to all the contact resistances occuring along the cable. Because of the resistances 39, it is possible to load each cable wire with the same current during the normal operation of the cable, thereby avoiding an unequal current distribution within the cable. The resistances of the leads 43 and 44 are chosen so that this function of the terminal resistances 39 is not impaired by the switching device.

The switching operation is begun by first opening superconductive switch 32. This commutates the current flowing in the cable wires 30 and in the superconductors 31 directly, or through the connecting leads 43, to the superconductors 34 thereby causing the latter to transfer into the electrically normal conducting state. During this transfer the total current in the cable is commutated to the conductor branch containing the switch 38. Following this commutation, the superconductive switch 35 is opened, and then switch 38 is also opened, thereby interrupting the current. By an appropriate selection of the resistances of the connecting leads 43, it is possible to change the current in the individual cable wires only slightly when opening the switch 32. The resistances of the connecting leads 43 should be selected sufficiently small so that when switch 32 is opened, the current flows from the conductors 31, which are not connected in parallel with superconductors 34, into the connecting leads 43 and flows from the connection point of leads 43 standing at 20° K, or 77° K, into the superconductors 34. Since the connecting leads 43 are connected with each other at a point of relatively low temperature, the resistance of the leads 43 is further reduced. If, on the other hand, all superconductors 31 are switched in parallel with appropriately thinner superconductors 34, the resistance of the leads 43 will have no influence upon the current distribution in the cable wires when switch 32 is opened and may be selected to have a resistance as high as the resistance of the connecting leads 44.

To illustrate the construction of the switching device according to FIG. 3, it is assumed that the superconducting cable has 127 wires of niobium–65 atom percent titanium each having a diameter of about 0.18 mm., that each wire is surrounded with a stabilization jacket of the purest aluminum of 1.3 mm. outside diameter and that the switching device is to withstand a current of 30 kiloamperes in the superconducting state. The same wires are used for the 127 superconductors 31 of the controllable superconductive section as for the cable. For superconductors 34, 40 uncoated niobium–65 atom percent titanium wires of 0.10 mm. diameter are used and are connected in parallel with 40 of the 127 superconductors 31. The resistance of the niobium-titanium contacts 33 and 36 of the superconductive switches 32 and 35 amounts to approximately $10^{19}$ ohm per contact. The connecting leads 43 have a resistance of about $10^{13}$ ohm, and the connecting leads 44, a resistance of about $10^{11}$ ohm. The terminal resistances 39 should have a resistance of about $2 \times 10^{15}$ ohm, a resistance much greater than the resistances of contacts 33 and 36 as well as other contact resistance which occur along the cable, the latter also amounting to about $10^{19}$ ohm. Because of the relatively low resistance of the individual contact leads 43 of $10^{13}$ ohm, after switch 32 is opened, the resistances for the 87 cable wires 30 which are not connected in parallel with superconductors 34 are only about $3 \times 10^{13}$ ohm higher than the other 40 cable wires. Since this difference in resistance is only present during the period between the opening of switch 32 and the opening of switch 35, a time period amounting to at most 1 millisecond, the current distribution in the cable wires changes only by about 1 percent. To produce the necessary commutating voltage, the superconductors 34 should have a resistance of about 4,000 ohms in the electrically normal conducting state. This results in a required length of about 31 m. for the niobium–65 atom percent titanium superconductors of the aforementioned dimensions. Under these conditions, a resistivity of $10^{14}$ ohm-cm. is assumed.

In order to minimize inductivity, the 127 superconductors 31 and the 40 thinner superconductors 34 are thoroughly intermixed. This may be accomplished by placing the conductors 31 and 34 next to each other as a band so that two adjacent conductors 31 are always followed by one conductor 34. The conductors 31 and 34 are placed in parallel on a length of 31 m. and are all insulated relative to each other. These conductors may be woven into a web whose warp threads consist of conductors 31 and 34 and whose wool threads are made of insulating material. A band having a width of approximately 340 mm. is obtained by placing conductors 31, 34 on 2 mm. centers. This band may be folded over many times and crimped at the folding points by insulating rollers having a thickness of approximately 5 mm. A controllable superconductive section constructed in this manner requires a volume of about 50 liters which may be filled with liquid helium.

If at the moment of disconnection, the cable is loaded with a smaller current rather than with the maximum allowable current, the commutating voltage applied over the controllable superconducting section will also become smaller. Nevertheless, the commutation is still effected so quickly at currents which are not too small, that the disconnect switch 35 may be opened after approximately 1 millisecond. However, if the current flowing in the cable is so small that the critical current density of the superconductors 34 is no longer exceeded, the cable can not be disconnected. In order to disconnect the cable in this instance, a capacitor which discharges into the controllable superconductive section can be provided. The capacitor preferably stands at room temperature.

Figure 4:
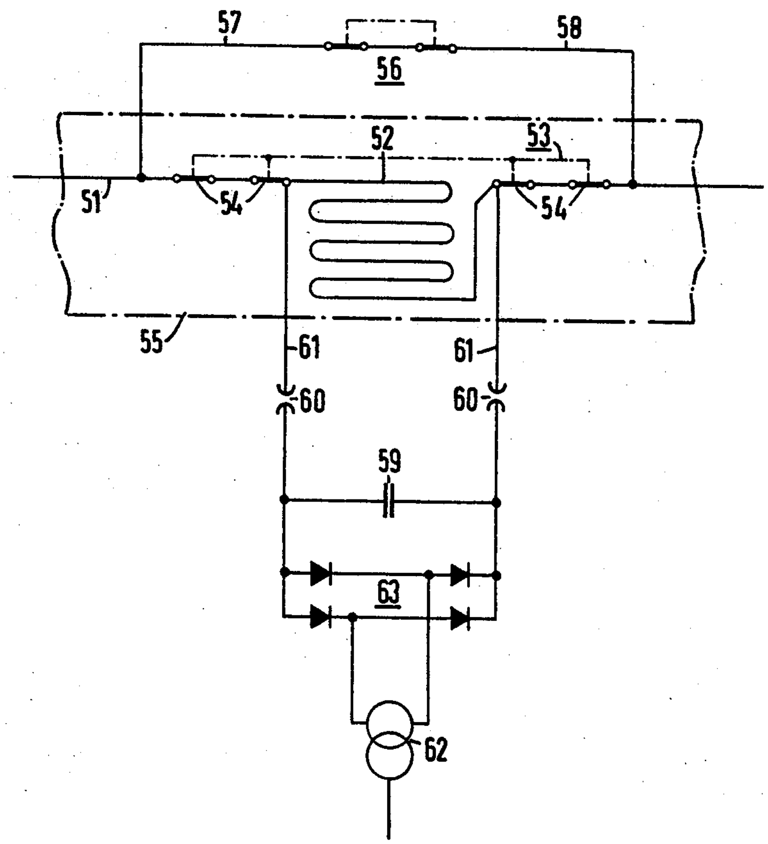
FIG. 4 shows a schematic diagram of a switching device of the present invention equipped with a capacitor arranged to discharge through the controllable superconductive section.

FIG. 4 illustrates a switching device wherein means are provided for increasing the current intensity in the controllable superconductive section above the critical current. The DC cable to be disconnected is indicated as 51 and the controllable superconductive section as 52. A superconductive disconnect switch 53 connected in series with the controllable superconductive section 52 is subdivided into several switching paths 54 which are electrically connected in series. The cable 51, the controllable superconductive section 52 and the superconductive disconnect switch 53 are kept, for example, at the temperature of liquid helium and are enclosed by a suitable heat insulator 55. A power switch 56 is connected in parallel with the controllable superconductive section 52 and with the superconductive disconnect switch 53. The switch 56 stands at room temperature and is subdivided into several switching paths electrically connected in series. The leads 57 and 58 are led out through the heat insulator. A capacitor 59 also stands at room temperature and can be connected through ignitable spark gaps 60 and leads 61 to the controllable superconductive section 52, the leads being guided through the heat insulator. Capacitor 59 is dischargeable through the superconductive section 52. For charging the capacitor 59, an insulating transformer 62 is provided and connected through rectifier 63 with the capacitor 59. The rectifiers are connected so that the discharge current of capacitor 59 has the same direction as the direct current which flows through cable 51. Therefore, when capacitor 59 discharges, the current flowing in the controllable superconductive section 52 is increased.

For the discharge current of capacitor 59 to flow almost entirely through the controllable superconductive section 52, the inductivity of section 52 must be small relative to the inductivity of the conductor branch containing the power switch 56. The inductivity of section 52 must also be small relative to the inductivity of the connecting leads 57 and 58 of the power switch 56 and to the inductivity of the cable 51.

To illustrate a construction of the switching device of FIG. 4, it is assumed that the controllable superconductive section 52 can carry a current up to approximately 30 kiloamperes without transferring into the electrical normal conducting state. If the material used for the controllable superconductive section is niobium–65 atom percent titanium with a critical current density of about $5 \times 10^5$ ampere/cm.$^2$, the superconducting total cross section of the controllable superconductive section should amount to approximately 6 mm.$^2$. The controllable superconductive section 52 can be subdivided into a plurality of over 100 individual wires connected in parallel. In addition, if the residual current, which flows through contacts 54 of superconductive disconnect switch 53 following the transfer of section 52 into an electrically normal conducting state must not be higher than 3 ampere, and if the resistance of the circuit branch which contains the power switch 56 amounts to about $10^{12}$ ohm, the section 52 must have a resistance of about 100 ohm in the electrically normal conducting state. With the normal conducting niobium–65 atom percent titanium having a resistivity of about $10^{14}$ ohm-cm., this will result in a required total length of about 600 m. for the individual conductors of section 52. The individual conductors can again be placed next to one another, formed into a band and folded over many times. As a result, the inductivity of section 52 should amount to about $10^{16}$ to $10^{17}$ henry. This makes it small with respect to the inductivity of the circuit branch containing the switch 56 which may as assumed to be approximately $10^{15}$ henry, and small compared to the inductivity of cable 51 which is about 1 henry.

To obtain short switching periods, the rising time of the discharge current pulse of the capacitor 59, and consequently the capacitance of the capacitor 59, should not be too great. On the other hand, the capacitor must be capable of storing enough energy to transfer section 52 into the electrically normal conducting state. To ensure that the cable can be disconnected even when not carrying current, the discharge current of the capacitor should be at least 40 kiloamperes. Current pulses of such intensity with rise times of less than1 millisecond can be obtained from a capacitor 59 having a capacitance of about 0.04 farad if a voltage of from 500 to 1,000 v. is applied to the capacitor through the rectifier 63. For a switching device having the foregoing component values, the cable current is commutated to the power switch 56 in about 0.2 millisecond after initiating the switching process so that, after this period, the superconductive disconnect switch 53, and then the power switch 56, may be opened.

The insulation of the isolating transformer 62 must be designed for at least the line to ground voltage of the superconducting cable. In the foregoing example, the insulation design voltage can amount to about 50 kilovolts.

To initiate the switching process, the spark gaps 60 can be fired with a voltage pulse causing the capacitor 59 to discharge through the controllable superconductive section 52. This transfers section 52 into the electrically normal conducting state. After the cable current has been commutated to the power switch 56, the switches 53 and 56 are opened. When switch 53 is opened, section 52 and the capacitor 59 are disconnected from the cable 51 and assume ground potential. When the spark gaps 60 are extinguished, the capacitor 59 is recharged. In lieu of the spark gap 60, other suitable switches may be used to connect capacitor 59 to section 52. If each cable wire is assigned a separate superconductor in the controllable superconductive section as shown in the device of FIG. 3, then in the switching device of FIG. 4 each superconductor is provided with a disconnect switch 53 and a spark gap 60. However, only one capacitor 59 and one charging device are required.

If the DC cable to be switched possesses an outgoing line and a return line which lie symmetrically with respect to ground at a positive or negative voltage, it is advisable to place a switching device of the present invention in the return line as well as in the outgoing line.

In lieu of the superconductive switches, very low resistance switches may be used under certain circumstances in the switching device of the present invention.

In addition to its use with superconductive high current cables, the switching device of the present invention can be used with other electrical apparatus and cables.

I claim:

1. A switching device for use with superconductive high current cables, comprising superconductive circuit means providing a high resistance in the normal conducting state, a superconductive disconnect switch in series connection with said circuit means, a power switch at room temperature in parallel connection with said circuit means, control means connected to said circuit means for increasing the intensity of current in said circuit means to a value greater than the critical current intensity whereby said circuit means is transferred from the superconducting state to said normal state, said control means including means for actuating it at a selectable time.

2. A switching device as claimed in claim 1, wherein said circuit means has a reducible cross section and said control means functions to reduce the area of said cross section.

3. A switching device as claimed in claim 1, wherein said circuit means comprises a plurality of mutually insulated individual conductors, said conductors being divided into two groups, one of said groups having a greater number of said conductors than the other, and said control means comprises a superconductive switch connected between said one of said groups and said disconnect switch.

4. A switching device as claimed in claim 1, wherein said switching device is utilized with a cable having a plurality of mutually insulated superconductive wires coated with electrically normal conducting metal for providing electrical stabilization, and wherein said circuit means has a plurality of individual superconductors coated with electrically normal conducting metal, said individual superconductors being connected to the superconductive wires of the cable respectively, said superconductive disconnect switch having respective switching contacts for each of said individual superconductors, and said control means comprises a superconductive switch having respective switching contacts for each of said individual superconductors, and a plurality of ancillary superconductors having a lower critical current, each of said ancillary superconductors being connected in parallel with a portion of a corresponding one of said individual superconductors.

5. A switching device as claimed in claim 1, wherein said control means has a capacitor at room temperature for discharging current into said circuit means.

6. A switching device as claimed in claim 1, wherein said power switch has a plurality of switching paths connected in series.

7. A switching device as claimed in claim 1, wherein said disconnect switch has a plurality of switching paths connected in series.

8. A switching device as claimed in claim 4, wherein the conductors of the two groups of conductors of said circuit means are spatially intermixed with each other whereby the mutual inductivity between said groups is reduced to a minimum.

9. A switching device as claimed in claim 4, wherein said superconductive disconnect switch has a plurality of switching contacts each for a corresponding one of said conductors of said one of said groups.

10. A switching device as claimed in claim 5, wherein the ancillary superconductors of said control means bridge corresponding ones of the contacts of the switch of said control means.

11. A switching device as claimed in claim 5, wherein said circuit means has two connection nodes, said switching device further comprises junction points each at a temperature higher than said nodes, connection circuits for providing respective electrical connections between said nodes and said junction points, said connecting circuits being separated from each other, and said power switch is connected between said junction points.

12. A switching device as claimed in claim 6, wherein said circuit means has an inductivity less than that of the cable.

13. A switching device as claimed in claim 6, wherein said power switch and said connecting circuits form a circuit branch, said circuit means having an inductivity less than that of said circuit branch.

14. A switching device as claimed in claim 6, further comprising ignitable spark gaps connecting said capacitor to said circuit means.